(12) United States Patent
Lin

(10) Patent No.: US 10,559,513 B2
(45) Date of Patent: Feb. 11, 2020

(54) CIRCUIT BOARD AND PACKAGED CHIP

(71) Applicant: MStar Semiconductor, Inc., Hsinchu Hsien (TW)

(72) Inventor: You-Wei Lin, Hsinchu Hsien (TW)

(73) Assignee: MEDIATEK INC., Hsinchu (TW)

( * ) Notice: Subject to any disclaimer, the term of this patent is extended or adjusted under 35 U.S.C. 154(b) by 0 days.

(21) Appl. No.: 15/850,376

(22) Filed: Dec. 21, 2017

(65) Prior Publication Data

US 2019/0035708 A1 Jan. 31, 2019

(30) Foreign Application Priority Data

Jul. 28, 2017 (TW) .............................. 106125479 A

(51) Int. Cl.

| *H01L 23/367* | (2006.01) |
|---|---|
| *H01L 23/498* | (2006.01) |
| *H01L 23/552* | (2006.01) |
| *H01L 23/31* | (2006.01) |
| *H01L 23/00* | (2006.01) |

(52) U.S. Cl.
CPC ........ *H01L 23/367* (2013.01); *H01L 23/3128* (2013.01); *H01L 23/49816* (2013.01); *H01L 23/49822* (2013.01); *H01L 23/49838* (2013.01); *H01L 23/552* (2013.01); *H01L 24/48* (2013.01); *H01L 2224/48091* (2013.01); *H01L 2224/48106* (2013.01); *H01L 2224/48227* (2013.01); *H01L 2924/3025* (2013.01)

(58) Field of Classification Search
None
See application file for complete search history.

(56) References Cited

U.S. PATENT DOCUMENTS

| 5,371,404 | A | * | 12/1994 | Juskey | .................... | H01L 23/04 |
|---|---|---|---|---|---|---|
|  |  |  |  |  |  | 257/659 |
| 7,050,304 | B2 | * | 5/2006 | Hsu | ....................... | H01L 23/367 |
|  |  |  |  |  |  | 165/185 |
| 8,946,886 | B1 |  | 2/2015 | Fuentes et al. |  |  |
| 9,236,356 | B2 |  | 1/2016 | Yang et al. |  |  |
| 9,589,905 | B2 |  | 3/2017 | Choi et al. |  |  |
| 2007/0040259 | A1 |  | 2/2007 | Hsu |  |  |

FOREIGN PATENT DOCUMENTS

| CN | 103400825 A | 11/2013 |
|---|---|---|
| CN | 104637924 A | 5/2015 |
| JP | 2011-87497 A | 9/2011 |
| TW | 465806 U | 11/2001 |
| TW | 200709441 A | 3/2007 |
| TW | 201234542 A | 8/2012 |

* cited by examiner

*Primary Examiner* — Long Pham
(74) *Attorney, Agent, or Firm* — McClure, Qualey & Rodack, LLP

(57) ABSTRACT

A circuit board includes an upper circuit and a lower surface that are opposite to each other, a plurality of heat sink bonding pads, and a plurality of heat sink conductive pads. The heat sink bonding pads are disposed on the upper surface and electrically insulated from one another, and are used to electrically connect to a heat sink. The heat sink conductive pads are disposed on the lower surface, electrically insulated from one another, and electrically connected to the heat sink bonding pads, respectively.

10 Claims, 5 Drawing Sheets

CIRCUIT BOARD AND PACKAGED CHIP

This application claims the benefit of Taiwan application Serial No. 106125479, filed Jul. 28, 2017, the subject matter of which is incorporated herein by reference.

BACKGROUND OF THE INVENTION

Field of the Invention

The invention relates in general to a circuit board and a packaged chip, and more particularly to a circuit board and a packaged chip in which an electrical connection between a heat sink and the circuit board can be tested through an electrical signal.

Description of the Related Art

With the evolution and development of electronic products, electronic products have become indispensables in the modern world. Among many devices, chips are extensively applied in electronic products. During an operation of a chip, heat is inevitably produced, raising the temperature of the chip. To prevent the operation of the chip from effects of high temperatures, a heat sink, for example, is usually provided in a packaged chip. However, given an unsatisfactory adhesion condition of a heat sink, a so-called antenna effect may be resulted; that is, one end of the heat sink with the unsatisfactory adhesion condition may receive external electromagnetic signals that interfere the operation of the chip, or may transmit electromagnetic signals that affect other devices.

SUMMARY OF THE INVENTION

It is one object of the present invention to provide a circuit board and a packaged chip. A plurality of heat sink bonding pads and a plurality of heat sink conductive pads are electrically connected through a plurality of heat sink traces that are insulated from one another in the circuit board, respectively, so as to identify a packaged chip including a heat sink with an unsatisfactory adhesion condition.

According to an embodiment of the present invention, a circuit board includes an upper surface and a lower surface that are opposite to each other, a plurality of heat sink bonding pads, and a plurality of heat sink conductive pads. The heat sink bonding pads are disposed on the upper surface, electrically insulated from one another, and are used to electrically connect to a heat sink The heat sink conductive pads are disposed on the lower surface, electrically insulated from one another, and electrically connected to the heat sink bonding pads, respectively.

According to another embodiment of the present invention, a packaged chip includes a circuit board and a heat sink. The heat sink is adhered on heat sink bonding pads of the circuit board, and is electrically connected to the heat sink bonding pads. The heat sink bonding pads are electrically to one another through the heat sink.

The above and other aspects of the invention will become better understood with regard to the following detailed description of the embodiments. The following description is made with reference to the accompanying drawings.

DETAILED DESCRIPTION OF THE INVENTION

For one skilled in the art to better understand the present invention, constituents and expected effects of the present invention are described in detail in the embodiments with the accompanying drawings below. Modifications based on different perspectives and applications may be made to the details of the disclosure without departing from the spirit of the present invention. It should be noted that, the drawings are simplified diagrams for illustrative purposes, and are not to be construed as limitations to the fundamental concept of the present invention. The drawings depict only elements associated with the present invention, and are not drawn to actual numbers, shapes and sizes of the elements in applications. In actual applications, the numbers, shapes and sizes of these elements may be modified based on actual application requirements, and a layout of these elements may be more complex.

Figure 1:
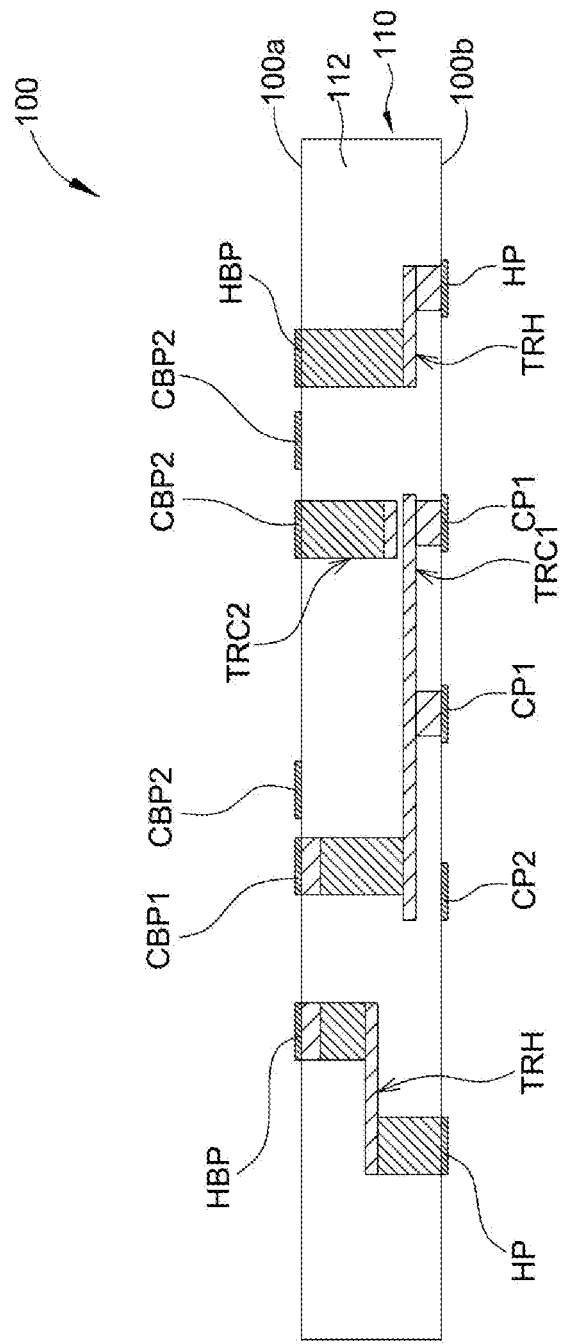
FIG. 1 is a section view of a circuit board according to an embodiment of the present invention.

FIG. 1 shows a section view of a circuit board according to an embodiment of the present invention. As shown in FIG. 1, a circuit board 100 of the embodiment includes an upper surface 100a and a lower surface 100b that are opposite to each other, a circuit layer 110, a plurality of heat sink bonding pads HBP and a plurality of chip bonding pads CBP1 and CBP2 disposed on the upper surface 100a of the circuit board 100, and a plurality of heat sink conductive pads HP and a plurality of chip conductive pads CP1 and CP2 disposed on the lower surface 100b of the circuit board 100.

The circuit layer 110 may include an insulation layer 112, a plurality of heat sink traces TRH, and a plurality of chip traces TRC1 and TRC2. The heat sink traces TRH and the chip traces TRC1 and TRC2 are disposed in the insulation layer 112, so as to allow the heat sink traces TRH and the chip traces TRC1 and TRC2 to be electrically insulated from one another through the isolation of the insulation layer 112. It is common general knowledge to one person skilled in the art that, the heat sink traces TRH and the chip traces TRC1 and TRC2 may be formed through multiple insulation layers and multiple conductive line layers, and conductive wires of different conductive wire layers may be electrically connected in a vertical direction through vias of the insulation layers. Thus, associated details are omitted herein.

The heat sink bonding pads HBP are for electrically connecting to a heat sink device (e.g., a heat sink), and are electrically insulated from one another. Further, the heat sink bonding pads HBP are electrically insulated from the chip bonding pads CBP1 and CBP2. That is, given that the circuit board 100 is not yet provided with electronic devices or heat sinks thereon, each heat sink bonding pad HBP is not electrically connected to another heat sink bonding pad HBP or any of the chip bonding pads CBP1 and CBP2. The heat sink bonding pads HBP may be electrically connected to the heat sink conductive pads HP through the heat sink traces TRH in the circuit layer 110, respectively. That is, given that the circuit board 100 is not yet provided with electronic devices or heat sinks thereon, each heat sink bonding pad HBP is electrically connected to one heat sink conductive pad HP through only one heat sink trace TRH, and is not electrically connected to the chip conductive pads CP1 and CP2. The heat sink conductive pads HP are electrically insulated from one another, and are further electrically insulated from the chip conductive pads CP1 and CP2. That is, given that the circuit board 100 is not yet provided with electronic devices or heat sinks thereon, each heat sink conductive pad HP is not electrically connected to another heat sink conductive pad HP or any of the chip conductive pads CP1 and CP2. The heat sink conductive pads HP are for electrically connecting to an external ground terminal.

The chip bonding pads CBP1 and CBP2 are for electrically connecting to an electronic device (e.g., a chip). The chip bonding pads CBP1 may be used to electrically connect to a ground terminal of an electronic device, and may be, without electrically connecting to the heat sink conductive pads HP, electrically connected to at least one of the chip conductive pads CP1 through the chip traces TRC1 in the circuit layer 110. For example, the chip bonding pad CBP1 may be electrically connected to two chip conductive pads CP1. The chip conductive pads CP1 are for electrically connecting to an external ground terminal. The chip bonding pads CBP2 are for electrically connecting to a non-ground terminal (e.g., other voltage signal terminals) of the electronic device, and may be electrically connected to one chip conductive pad CP2 through the chip trace TRC2 in the circuit layer 110. The chip conductive pads CP2 are for electrically connecting to an external non-ground terminal (e.g., a voltage signal). It should be noted that, the electrical connections between the chip bonding pads CBP1 and CBP2 and the chip conductive pads CP1 and CP2 are not limited to the above examples. In other embodiments, the electrical connections between the chip bonding pads CBP1 and CBP2 and the chip conductive pads CP1 and CP2 may be designed based on actual requirements.

Figure 2:
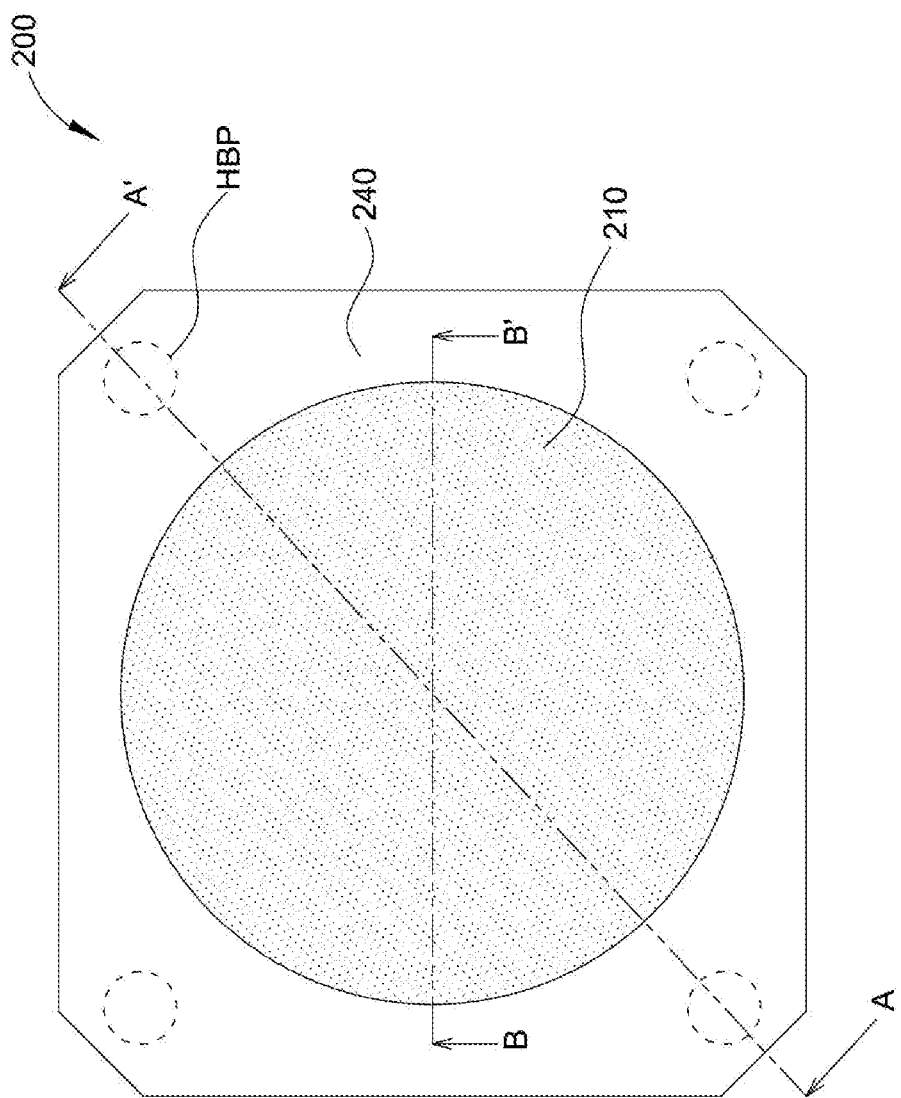
FIG. 2 is a top view of a packaged chip according to an embodiment of the present invention.
Figure 3:
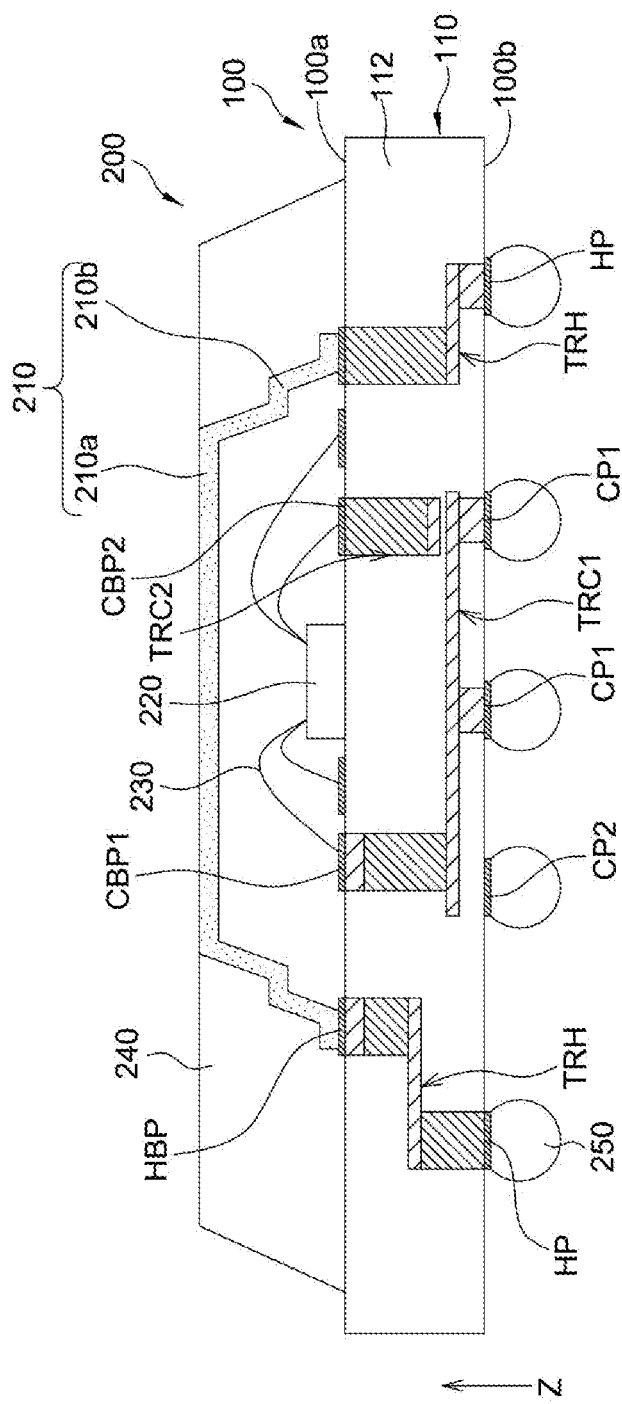
FIG. 3 is a section view of a packaged chip along a section line A-A' in FIG. 2.
Figure 4:
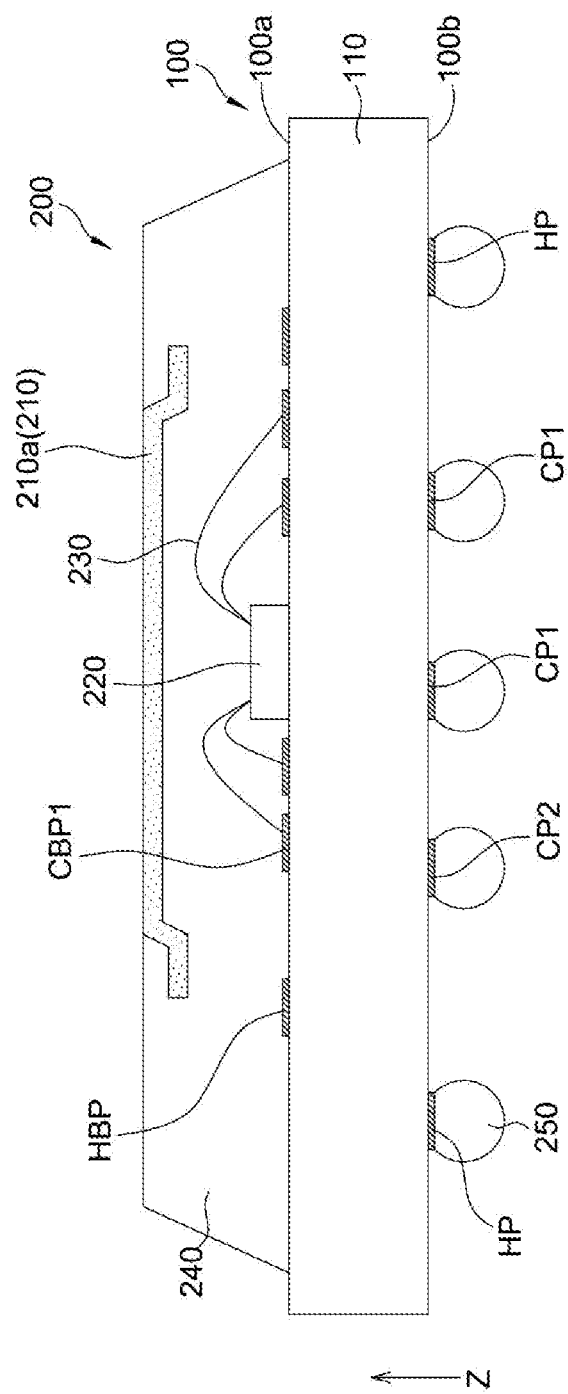
FIG. 4 is a section view of a packaged chip along a section line B-B' in FIG. 2.

FIG. 2 shows a top view of a packaged chip 200 according to an embodiment of the present invention. FIG. 3 shows a section view of the packaged chip 200 along a section line A-A' in FIG. 2. FIG. 4 shows a section view of the packaged chip 200 along a section line B-B' in FIG. 2. As shown in FIG. 2 and FIG. 3, the packaged chip 200 of the embodiment includes a circuit board 100, a heat sink 210, a chip 220, a metal wire 230, a packaging glue 240 and a solder ball 250. The structure of the circuit board 100 may be referred from the above description, and shall be omitted herein for brevity.

The heat sink 210 is electrically connected to the heat sink bonding pad HPB of the circuit board 100 through an adhesive agent (e.g., a conductive glue). The heat sink 210, in a top view direction Z of the circuit board 200, covers the chip 200, and an upper surface of the heat sink 210 is revealed outside the packaging glue 240, so as to dissipate heat that is generated by the chip 220 in operation. Because the heat sink 210 includes a conductive material (e.g., metal) having good heat dissipation, the heat sink 210 additionally provides an electromagnetic interference (EMI) protection effect for blocking the chip 220 from interference of external signals.

Figure 5:
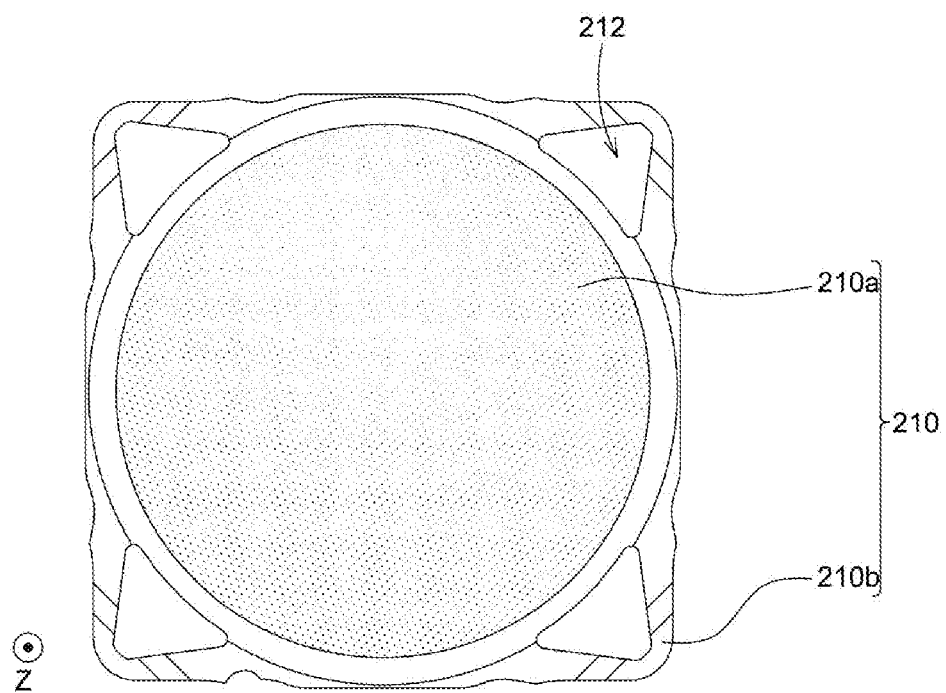
FIG. 5 is a top view of a heat sink according to an embodiment of the present invention.

FIG. 5 shows a top view of the heat sink 210 according to an embodiment of the present invention. The heat sink 210 includes four pins 210b, which are respectively adhered on the four heat sink pads HBP on the circuit board 100 to electrically connect the heat sink 210 to a ground terminal through the four heat sink conductive pads HP, as shown in FIG. 2 and FIG. 3. Further, each of the pins 210b may have an opening 212 to accordingly reduce the possibility of breaking the pins 210b after multiple expansions and contractions. It should be noted that, the number of the pins 210b is not limited to four. In another embodiment, the number of the pins 210b is eight. In this situation, the circuit board 100 correspondingly includes eight heat sink bonding pads HBP and eight heat sink conductive pads HP. It should be noted that, the number of the pins 210b of the present invention is not limited to being an even number.

The chip 220 may be electrically connected to the chip bonding pad CBP on the circuit board 100. In this embodiment, a solder pad of the chip 220 is electrically connected to the chip bonding pads CBP1 and CBP2 by, for example but not limited to, wire bonding. In an alternative embodiment, the solder pad may also be electrically connected to the chip bonding pads CBP1 and CBP2 by flip-chip or other methods.

The heat sink 210 is provided with the packaging glue 240 at both its interior and exterior, and the packaging glue 240 covers the chip 220. In another embodiment, the packaging glue is provided only at the interior of the heat sink. In another embodiment, the packaged chip may exclude the packaging glue.

The solder ball 250 is connected to the heat sink conductive pads HP and the chip conductive pads CP1 and CP2 to increase the rate of successfully joining the packaged chip 200 with other circuit boards. In another embodiment, the packaged chip may also exclude the solder ball.

It should be noted that, in a conventional packaged chip, the ground traces connected to the heat sink conductive pads are electrically connected to one another. In this situation, even if the adhesion between the pins of the heat sink and the heat sink bonding pads is unsatisfactory, a heat sink conductive pad may still be electrically connected to other heat sink conductive pads via the ground traces. As a result, whether the pins of the heat sink and the heat sink bonding pads are adhered poorly cannot be determined based on a resistance value between two heat sink conductive pads, and so a packaged chip with an antenna effect cannot be identified.

However, in the present invention, when the heat sink 210 is not yet adhered to the circuit board 100, the heat sink conductive pads HP are electrically insulated from one another. When the heat sink 210 is adhered to the circuit board 100, the heat sink conductive pads HP originally electrically insulated from one another in the circuit board 100 can electrically connect to the heat sink 210 through the respective heat sink traces TRH to further electrically connect to one another through the heat sink 210. Thus, when the pins 210b of the heat sink 210 and the heat sink bonding pads HBP are poorly adhered, the resistance values between the corresponding heat sink conductive pad HP and other heat sink conductive pads HP are significantly increased. As such, the resistance value between two heat sink conductive pads HP can be measured to determine whether a situation where the pins 210b of the heat sink 210 and the heat sink bonding pads HBP are poorly adhered exists, so as to further identify a packaged chip with an antenna effect. For example, when the resistance value between any two heat sink conductive pads does not fall within a predetermined range, it means that the pins of the heat sink and the heat sink bonding pads are poorly adhered, and the packaged chip has an antenna effect and is thus determined as a defective product.

While the invention has been described by way of example and in terms of the embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A circuit board, comprising:
   an upper surface and a lower surface that are opposite to each other;
   a plurality of heat sink bonding pads, disposed on the upper surface, and electrically insulated from one another, for electrically connecting to a heat sink;
   a plurality of heat sink conductive pads, disposed on the lower surface, electrically insulated from one another, and electrically connected to the heat sink bonding pads, respectively; and
   a circuit layer, comprising a plurality of heat sink traces, wherein the heat sink conductive pads are electrically connected to the heat sink bonding pads through the heat sink traces, respectively, and the heat sink traces are electrically insulated from one another.

2. The circuit board according to claim 1, further comprising:
   a plurality of chip bonding pads, disposed on the upper surface, and electrically insulated from the chip bonding pads, for electrically connecting to an electronic device.

3. The circuit board according to claim 2, further comprising:
   a plurality of chip conductive pads, disposed on the lower surface, and electrically insulated from the heat sink conductive pads.

4. The circuit board according to claim 3, wherein the circuit layer further comprises:
   a plurality of chip traces;
   wherein, at least one of the chip conductive pads is connected to at least one of the chip bonding pads through at least one of the chip traces, and the heat sink traces are electrically insulated from the chip traces.

5. A packaged chip, comprising:
   a circuit board, comprising:
   an upper surface and a lower surface that are opposite to each other;
   a plurality of heat sink bonding pads, disposed on the upper surface, and electrically insulated from one another, for electrically connecting to a heat sink;
   a plurality of heat sink conductive pads, disposed on the lower surface, electrically insulated from one another, and electrically connected to the heat sink bonding pads, respectively;
   a heat sink, adhered on the heat sink pads of the circuit board, and electrically connected to the heat sink bonding pads, the heat sink bonding pads being electrically connected to one another through the heat sink; and
   a circuit layer, comprising a plurality of heat sink traces, wherein the heat sink conductive pads are electrically connected to the heat sink bonding pads through the heat sink traces, respectively.

6. The packaged chip according to claim 5, further comprising:
   an electronic device, disposed between the circuit board and the heat sink;
   wherein, the circuit board further comprises a plurality of chip bonding pads, the chip bonding pads are disposed on the upper surface and electrically connected to the electronic device, and the heat sink bonding pads are electrically insulated from the chip bonding pads.

7. The packaged chip according to claim 6, wherein the circuit board further comprises a plurality of chip conductive pads disposed on the lower surface of the circuit board, and the heat sink conductive pads are electrically insulated from the chip conductive pads.

8. The packaged chip according to claim 7, wherein the circuit layer further comprises a plurality of chip traces, at least one of the chip conductive pads is electrically connected to at least one of the chip bonding pads through at least one of the chip traces, and the heat sink traces are electrically insulated from the chip traces.

9. The packaged chip according to claim 5, further comprising:
   a packaging glue, disposed on the circuit board.

10. The packaged chip according to claim 5, further comprising:
    a plurality of solder balls, connected to the heat sink conductive pads, respectively.

* * * * *